United States Patent
Ochi et al.

(10) Patent No.: US 10,365,446 B2
(45) Date of Patent: Jul. 30, 2019

(54) OPTICAL MODULE STRUCTURE

(71) Applicant: Panasonic Intellectual Property Management Co., Ltd., Osaka (JP)

(72) Inventors: Shozo Ochi, Osaka (JP); Daisuke Sakurai, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/180,621

(22) Filed: Nov. 5, 2018

(65) Prior Publication Data
US 2019/0137708 A1    May 9, 2019

(30) Foreign Application Priority Data

Nov. 6, 2017 (JP) .................................. 2017-213372
Oct. 22, 2018 (JP) .................................. 2018-198255

(51) Int. Cl.
*G02B 6/42* (2006.01)

(52) U.S. Cl.
CPC .......... *G02B 6/4274* (2013.01); *G02B 6/4268* (2013.01)

(58) Field of Classification Search
CPC .................... G02B 6/4268; G02B 6/4274
See application file for complete search history.

(56) References Cited

U.S. PATENT DOCUMENTS

| 8,768,122 | B2* | 7/2014 | Yamaji | G02B 6/4214 385/38 |
| 2005/0281513 | A1* | 12/2005 | Choi | G02B 6/4214 385/89 |
| 2012/0321250 | A1* | 12/2012 | Yamaji | G02B 6/4214 385/38 |
| 2017/0261693 | A1* | 9/2017 | Gambino | G02B 6/34 |
| 2017/0261703 | A1* | 9/2017 | Bowen | G02B 6/4214 |
| 2017/0365497 | A1* | 12/2017 | Edelstein | G05B 19/402 |
| 2018/0143374 | A1* | 5/2018 | Coolbaugh | G02B 6/122 |
| 2018/0156972 | A1* | 6/2018 | Kainuma | G02B 6/4272 |
| 2019/0004247 | A1* | 1/2019 | Huang | G02B 6/12004 |
| 2019/0025214 | A1* | 1/2019 | Rothberg | G01N 21/6486 |

FOREIGN PATENT DOCUMENTS

JP    5654317    1/2015

* cited by examiner

*Primary Examiner* — Sung H Pak
(74) *Attorney, Agent, or Firm* — Wenderoth, Lind & Ponack, L.L.P.

(57) ABSTRACT

An optical module structure includes a main substrate, an interposer substrate electrically connected to the main substrate via a first protruding electrode, a first communication LSI electrically connected to the interposer substrate via a second protruding electrode, an IC element electrically connected to the interposer substrate via a lateral-surface connection terminal of the interposer substrate and via a third protruding electrode, an Si bench substrate electrically connected to the IC element via a fourth protruding electrode and via a lateral-surface connection terminal of the Si bench substrate, an optical element electrically connected to the Si bench substrate via a fifth protruding electrode, and an optical fiber optically connected via an optical waveguide formed on the Si bench substrate.

9 Claims, 8 Drawing Sheets

OPTICAL MODULE STRUCTURE

TECHNICAL FIELD

The present invention relates to an optical module structure that converts an electrical signal into an optical signal to transmit or receive the optical signal.

BACKGROUND ART

Conventionally, as shown in FIG. 6, an optical module 50 has an internal waveguide 52 disposed in a groove formed on a surface of a first substrate 51 of both a light-emitting (transmission)-side optical module 50A and a light-receiving (reception)-side optical module 50B, and a mirror portion 53 for optical path conversion formed on a top of the groove.

The surface of the first substrate 51 of the light-emitting-side optical module 50A is mounted with a light-emitting element (optical element) 54A emitting an optical signal to a core of the internal waveguide 52 via the mirror portion 53. In the same manner, the surface of the first substrate 51 of the light-receiving-side optical module 50B is mounted with a light-receiving element (optical element) 54B receiving the optical signal from the core of the internal waveguide 52 via the mirror portion 53.

An external waveguide (optical fiber) 55 is optically coupled to the cores of the respective internal waveguides 52 in the light-emitting element 54A and the light-receiving element 54B.

The light-emitting element 54A or the light-receiving element 54B is flip-chip-mounted via bumps on the surface of the first substrate 51 corresponding thereto, with its mounting surface being a light-emitting surface of the light-emitting element 54A or a light-receiving surface of the light-receiving element 54B. The first substrates 51 are disposed on surfaces of separate second substrates (interposer substrates) 56, respectively. Surfaces of the second substrates 56 are respectively mounted with a signal processing unit (IC substrate) 57A on which an IC circuit for transmitting an electrical signal to the light-emitting element 54A is formed and a signal processing unit (IC substrate) 57B on which an IC circuit for receiving an electrical signal from the light-receiving element 54B is formed. The light-emitting element 54A and the signal processing unit 57A are electrically connected by a looped bonding wire 58, while the light-receiving element 54B and the signal processing unit 57B are electrically connected by another bonding wire 58. The modules 50A and 50B comprise their respective connectors 59 for electrically connecting the signal processing units 57A and 57B to other circuit devices, with the respective connectors 59 and the signal processing units being electrically connected by looped bonding wires 60, respectively.

In such an optical module 50, a conceivable technique for achieving 10 Gbs or more of high-speed transmission is speeding up per wiring line transmitting an electrical signal or multi-channelizing for simultaneously transmitting a plurality of electrical signals.

In the case of speeding up per wiring line, due to an impedance mismatch arising from inductance components of the bonding wires 58, degradation of high-frequency signals by delay induced by a signal reflection becomes not negligible. Since the inductance component is proportional to the length of the bonding wire 58, the length of the bonding wire 58 needs to be shortened for speedup per wiring line.

In the case of multi-channelizing, due to the parallel arrangement of a plurality of wirings, increase in crosstalk as mutual interference of electrical signals between wirings becomes an issue. In general, the crosstalk arises from capacitive coupling between wirings, and measures for its reduction can be for example shortening the wiring length, increasing the wiring interval, and shielding at a GND circuit (ground circuit).

However, demerits occur that the bonding wire 58 makes shielding at the GND circuit infeasible and that increasing the wiring interval results in upsizing of the optical module. Accordingly, even when considering the multi-channelization, the bonding wire 58 needs to be shortened in length.

FIG. 7 shows a sectional view of a bonding-wire-connected light-emitting-side optical module structure 40A-1 as another conventional optical module (see, e.g. Patent Document 1).

In the optical module structure 40A-1, a first substrate 1 has on its surface a recessed step 1g including a slant surface 1e slanting obliquely downward from a vicinity of bumps 12c of a light-emitting element 12a and a horizontal surface 1f extending horizontally from a lower end of the slant surface 1e.

A metal circuit (circuit patterned by sputtering of copper or gold) 12d connected to the bumps 12c of the light-emitting element 12a is formed along the slant surface 1e and the horizontal surface 1f, with an end of the metal circuit 12d on the horizontal surface 1f being a land 12e. By employing such a configuration, the height position of the land 12e on the horizontal surface 1f can be formed at a low position so as to approximate to the height position of a land 4c on a signal processing portion 4a toward the light-emitting element 12a.

The land 12e closer to the light-emitting element 12a and the land 4c on the signal processing portion 4a toward the light-emitting element 12a are electrically connected by a looped bonding wire 26.

A land 4d of the signal processing portion 4a associated with a connector 7 and a land 7a of the connector 7 on a surface of a second substrate 6 are electrically connected by a looped bonding wire 27.

The land 7a of the connector 7 is electrically connected, via a through-hole wiring 6a of the second substrate 6, to the connector 7 disposed on a back surface side of the second substrate 6.

In FIG. 7, by lowering the height position of the land 12e closer to the light-emitting element 12a using the recessed step 1g formed on the first substrate 1, a difference H in height from the land 4c of the signal processing portion 4a toward the light-emitting element 12a can be reduced. As a result, the length of the bonding wire 26 can be shortened, so that degradation of the high-frequency signal can be suppressed, enabling a high-speed transmission.

PATENT DOCUMENT

Patent Document 1: JP-5654317

SUMMARY OF THE INVENTION

Problem to be Solved by the Invention

However, in recent years, development of a system is advancing in which this optical module is used for high-speed transmission of 8K video or ultra-large data as in a data center. Such a system requires 50 Gbs or more of high-speed transmission, and a 4-level pulse amplitude modulation (PAM4) scheme is used as a transmission scheme of such ultra-large data.

FIG. 8 is a plan view of a conventional light-emitting-side optical module structure based on the 4-level pulse amplitude modulation (PAM4) scheme. PAM is an abbreviation for pulse amplitude modulation. In the conventional 2-level pulse amplitude modulation (PAM2), a bit string consisting of 0 and 1 is modulated and transmitted intact as a two voltage levels of pulse signal. On the other hand, PAM4 is a scheme in which the bit string consisting of 0 and 1 is modulated and transmitted as a pulse signal of four voltage levels 00, 01, 10, and 11, enabling the conventional data transmission amount to be doubled.

Such an optical module applied to the PAM4 scheme newly needs a communication LSI 801 incorporating a driver circuit and a receiver circuit for modulating 2-level into 4-level, resulting in updating of the optical module as a result of increase in the number of chips making up the optical module.

Moreover, speeding up and heightened frequencies bring about a problem that transmission loss increases by wirings such as bonding wires 804 connecting an Si bench substrate 802 and an IC substrate 803 or bonding wires 805 connecting the communication LSI 801 and the IC substrate 803.

Thus, the present invention intends to solve the conventional problems and its object is to provide an optical module structure capable of suppressing degradation of high-frequency signals to improve the transmission speed and downsizing, by shortening paths that connect chips making up the optical module.

Means for Solving Problem

In order to achieve the object, the optical module structure according to one aspect of the present invention includes a main substrate, an interposer substrate electrically connected to the main substrate via a first protruding electrode, a first communication LSI electrically connected to the interposer substrate via a second protruding electrode, an IC element electrically connected to the interposer substrate via a lateral-surface connection terminal of the interposer substrate and via a third protruding electrode, an Si bench substrate electrically connected to the IC element via a fourth protruding electrode and via a lateral-surface connection terminal of the Si bench substrate, an optical element electrically connected to the Si bench substrate via a fifth protruding electrode, and an optical fiber optically connected via an optical waveguide formed on the Si bench substrate.

Effect of the Invention

According to the optical module structure of the present invention, an optical module structure can be provided that is able to shorten the paths connecting the chips making up the optical module, thereby enabling degradation of high-frequency signals to be suppressed to improve the transmission speed and enabling the size thereof to be reduced.

EMBODIMENTS FOR CARRYING OUT THE INVENTION

Figure 1:
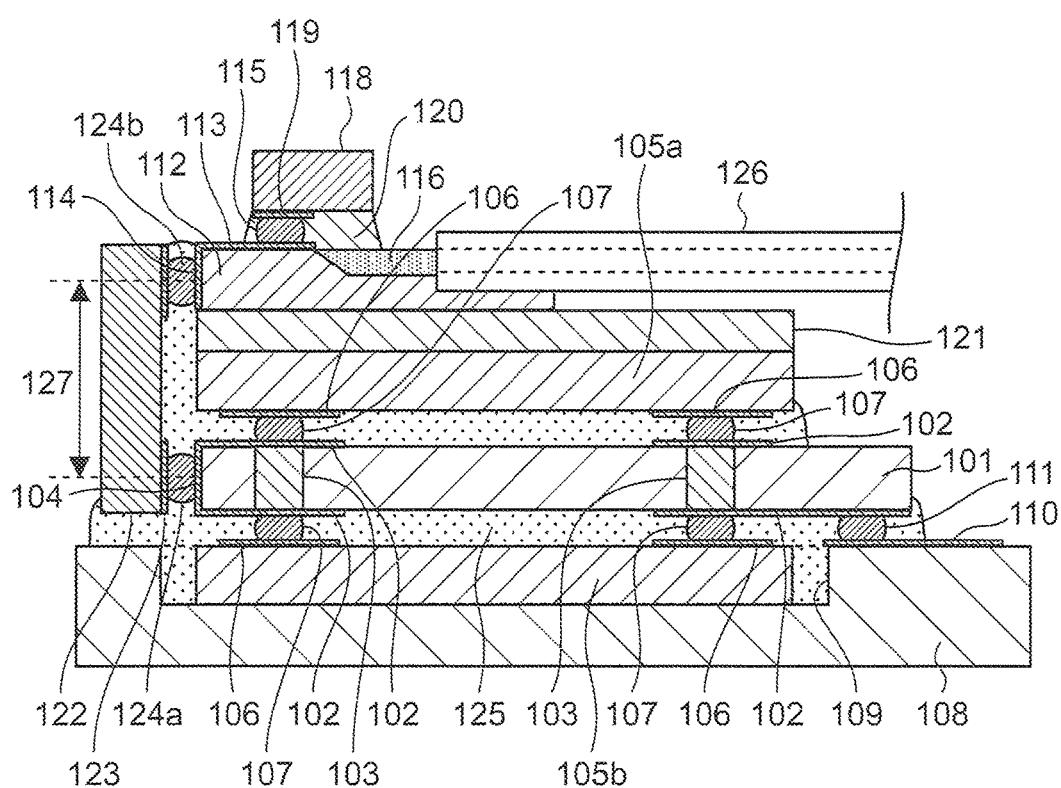
FIG. 1 is a sectional view showing a configuration of a light-receiving-side optical module structure in a first embodiment of the present invention.

Embodiments of the present invention will now be described with reference to the drawings. The same elements are designated by the same reference numerals and description thereof may be omitted.

First Embodiment

Figure 2:
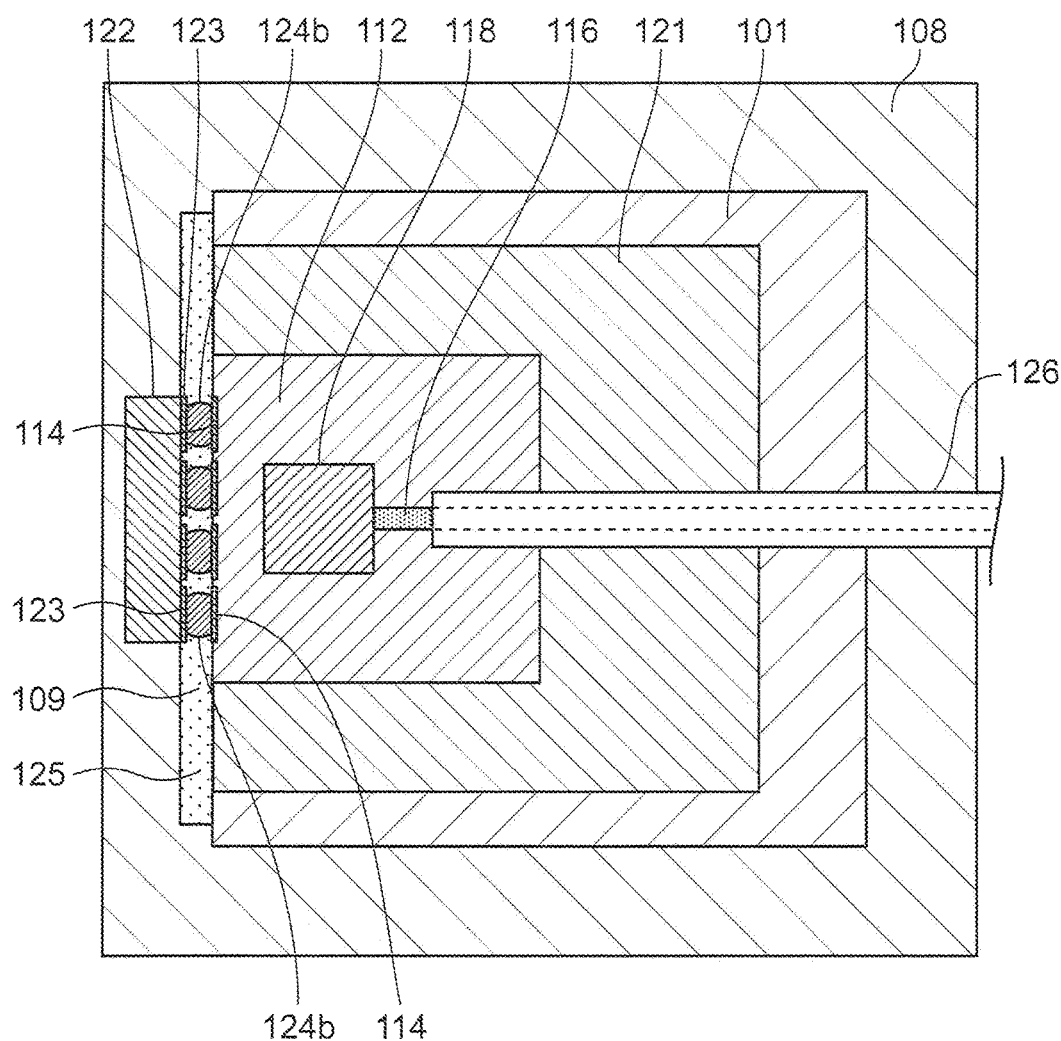
FIG. 2 is a plan view showing a configuration of the light-receiving-side optical module structure in the first embodiment of the present invention.

FIG. 1 is a sectional view of a light-receiving-side optical module structure that is an optical module structure in a first embodiment of the present invention, and FIG. 2 is a plan view of the light-receiving-side optical module structure in the first embodiment of the present invention.

<Structure>

The light-receiving-side optical module in the first embodiment of the present invention has a laminated structure that includes an interposer substrate 101, two communication LSIs 105a and 105b, and an Si bench substrate 112. A configuration is employed in which this laminated structure is disposed on a main substrate 108, with a light-receiving element 118 being disposed on a top surface shown of the laminated structure, with an IC element 122 being disposed on a lateral surface shown of the laminated structure.

As shown in FIG. 1, the communication LSI 105a is disposed on one main surface (top surface in FIG. 1) of the interposer substrate 101, while the communication LSI 105b is disposed on the other main surface (undersurface in FIG. 1).

Connection terminals 102 are formed on both the main surfaces of the interposer substrate 101, while connection terminals 106 are formed on the respective main surfaces (surfaces toward the interposer substrate 101) of the communication LSIs 105a and 105b. The connection terminal 102 on the top surface of the interposer substrate 101 and the connection terminal 106 of the communication LSI 105a are electrically connected via a second protruding electrode 107. The connection terminal 102 on the undersurface of the interposer substrate 101 and the connection terminal 106 of the communication LSI 105b are electrically connected via the second protruding electrode 107.

The main substrate 108 has on its one surface (top surface in FIG. 1) a cavity 109 that is a concave portion in which the communication LSI 105b is disposed. Specifically, the other main surface (undersurface in FIG. 1) of the communication LSI 105b is disposed on a bottom surface of the cavity 109 of the main substrate 108.

A connection terminal 110 is formed outside of the cavity 109 on the top surface of the main substrate 108. Part of the connection terminals 102 on the undersurface of the interposer substrate 101 confronts the connection terminal 110 of the main substrate 108 and is electrically connected thereto via a first protruding electrode 111.

The light-receiving element 118 is disposed on one main surface (top surface in FIG. 1) of the Si bench substrate 112. A connection terminal 113 is formed on the top surface of the Si bench substrate 112, while a connection terminal 119 is formed on an undersurface of the light-receiving element 118. The connection terminal 113 of the Si bench substrate 112 and the connection terminal 119 of the light-receiving element 118 are electrically connected via a fifth protruding electrode 115. A connection portion between the Si bench substrate 112 and the light-receiving element 118 is sealed by a sealant 120.

A heat-radiating sheet 121 for thickness adjustment is disposed between the other main surface (top surface in FIG. 1) of the communication LSI 105a and the other main surface (undersurface in FIG. 1) of the Si bench substrate 112 so that the communication LSI 105a and the Si bench substrate 112 are joined together via the heat-radiating sheet 121 for thickness adjustment.

The IC element 122 is disposed on the lateral surface side (left lateral surface side in FIG. 1) of the interposer substrate 101 and the Si bench substrate 112. The first embodiment employs a TIA element for example as the IC element 122. The TIA (Transimpedance Amplifier; Hereinafter, abbreviated to TIA) is an IC element for use in a receiving system of the optical communication system. A plurality of connection terminals 123 are formed on a main surface (right-hand surface in FIG. 1) of the IC element 122.

A lateral-surface connection terminal 104 is formed on a lateral surface (left lateral surface in FIG. 1) of the interposer substrate 101. As used herein, the lateral surface of the interposer substrate 101 refers to a surface connecting ends of the main surfaces (top surface and undersurface in FIG. 1) confronting each other of the interposer substrate 101. The lateral-surface connection terminal 104 of the interposer substrate 101 and one of the connection terminals 123 of the IC element 122 confront each other and are electrically connected via a third protruding electrode 124a.

A lateral-surface connection terminal 114 is formed on a lateral surface (left lateral surface in FIG. 1) of the Si bench substrate 112. As used herein, the lateral surface of the Si bench substrate 112 refers to a surface connecting ends of the main surfaces (top surface and undersurface in FIG. 1) confronting each other of the Si bench substrate 112. The lateral-surface connection terminal 114 of the Si bench substrate 112 and another one of the connection terminals 123 of the IC element 122 confront each other and are electrically connected via a fourth protruding electrode 124b.

A sealant 125 is disposed to seal a connection portion between the main substrate 108 and the interposer substrate 101, connection portions between the interposer substrate 101 and the communication LSIs 105a and 105b, and connection portions between the IC element 122 and the interposer substrate 101 and between the IC element 122 and the Si bench substrate 112.

The Si bench substrate 112 comprises an optical waveguide 116 via which the light-receiving element 118 and an optical fiber 126 are optically connected.

<Dimensions>

Although the members making up the optical module of the first embodiment do not have any specific shapes and sizes, it may be formed with dimension configurations which follow for example.

Main substrate 108: 10 mm×10 mm×1.0 mm thick
Interposer substrate 101: 6 mm×6 mm×0.4 mm thick
Communication LSI 105a, 105b: 5 mm×5 mm×0.4 mm thick
Si bench substrate 112: 3 mm×3 mm×0.4 mm thick
IC element 122: 2 mm×2 mm×0.25 mm thick
Light-receiving element 118: 1 mm×1 mm×0.15 mm thick At this time, a connection terminal pitch 127 of the IC element 122 is 1.5 mm that is the interval dimension between the connection terminal 123 on the IC element 122 connected to the interposer substrate 101 and the connection terminal 123 on the IC element 122 connected to the Si bench substrate 112.

A join height of the second protruding electrode 107 is 50 μm that connects the interposer substrate 101 and the communication LSI 105a.

In such dimension configurations, by setting to 0.65 mm the thickness of the heat-radiating sheet 121 for thickness adjustment disposed between the communication LSI 105a and the Si bench substrate 112, the interval dimension between the lateral-surface connection terminal 104 of the interposer substrate 101 and the lateral-surface connection terminal 114 of the Si bench substrate 112 can be adjusted to 1.5 mm. This allows the distance between the two connection terminals 123 of the IC element 122 to become equal to the distance between the lateral-surface connection terminal 104 of the interposer substrate and the lateral-surface connection terminal 114 of the Si bench substrate 112. Thus, the IC element 122 can be connected to and disposed on the lateral surfaces of the interposer substrate 101 and the Si bench substrate 112. The heat-radiating sheet 121 for thickness adjustment functions as a thickness adjusting sheet for adjusting the distance between the connection terminals 123 and the distance between the lateral-surface connection terminals 104 and 114, with its thickness being set depending on the distance to be adjusted.

In this manner, the optical module of the first embodiment can provide an optical module structure capable of shortening the paths connecting the elements making up the optical module, to suppress the degradation of high-frequency signals to improve the transmission speed, thereby achieving the downsizing.

Further details will hereinbelow be described of constituent members making up the optical module of the first embodiment.

<Connection Terminal>

The connection terminals 102, 106, 113, 119, and 123 are made of an electrically conductive material. Such an electrically conductive material may be aluminum for example, or a metal such as copper having a higher conductivity than that of aluminum, or may be copper rendered difficult to oxidize by being subjected to nickel/gold plating. The connection terminal 110 is made of an electrically conductive material. Such an electrically conductive material may be copper for example or may be copper, etc. rendered difficult to oxidize by being subjected to nickel/gold plating. The lateral-surface connection terminals 104 and 114 are made of an electrically conductive material. Such an electrically conductive material may be copper for example or may be copper, etc. rendered difficult to oxidize by being subjected to nickel/gold plating.

<Protruding Electrode>

The second protruding electrode 107, the first protruding electrode 111, the fifth protruding electrode 115, the third protruding electrode 124*a*, and the fourth protruding electrode 124*b* are made of an electrically conductive material. Such an electrically conductive material may be solder for example or may be a metal such as copper or gold.

<Interposer Substrate>

Although the interposer substrate 101 is formed from a ceramic substrate for example, it may be a buildup substrate, an aramid-epoxy substrate, etc.

<Main Substrate>

Although the main substrate 108 is formed from a glass epoxy substrate for example, it may be the buildup substrate, the aramid-epoxy substrate, the ceramic substrate, etc. In case that the optical module is disposed on another constituent member, the function of the main substrate may be included in the another constituent member.

<Cavity>

By setting the size of the cavity 109 to be 6 mm×6 mm×0.4 mm thick for example and by accommodating the communication LSI 105*b* having the same thickness in the cavity 109, the join height of both the second protruding electrode 107 and the first protruding electrode 111 becomes 50 μm so that the interposer substrate 101 and the main substrate 108 can be connected via a shortest path. Without being limited to such a case where the entire thickness of the communication LSI 105*b* is accommodated in the cavity 109, the case is also possible where part of the thickness of the communication LSI 105*b* is accommodated in the cavity 109.

<Heat-Radiating Sheet for Thickness Adjustment>

The heat-radiating sheet 121 for thickness adjustment has, as described above, both the function for thickness adjustment adjusting the distance between the Si bench substrate 112 and the communication LSI 105*a* and the function to radiate heat transferred from the Si bench substrate 112, the communication LSI 105*a*, etc. The heat-radiating sheet 121 for thickness adjustment may be made of film for example, or may be paste or silicone. The heat-radiating sheet 121 for thickness adjustment may be made of a material softer than that of the other laminates, i.e. the communication LSIs 105*a* and 105*b*, the interposer substrate 101, the main substrate 108, and the Si bench substrate 112. Use of such a soft material allows the heat-radiating sheet 121 for thickness adjustment to relieve stresses occurring at the respective connection portions, thus achieving an improvement in the reliability of connection.

If without using the heat-radiating sheet 121 for thickness adjustment the distance between the two connection terminals 123 is equal to the distance between the lateral-surface connection terminal 104 of the interposer substrate and the lateral-surface connection terminal 114 of the Si bench substrate 112, the heat-radiating sheet 121 for thickness adjustment may not be used.

<Communication LSI>

Although as an example the structure has been described where the two communication LSIs 105*a* and 105*b* are arranged on both the surfaces of the interposer substrate 101, such a structure is not limitative. In place of such a structure, the two communication LSIs 105*a* and 105*b* may be arranged on one main surface of the interposer substrate 101. The optical module may comprise only one communication LSI 105 or may comprise three or more ones. In the case of having only one communication LSI 105, the communication LSI 105 may be disposed on one main surface (top surface in FIG. 1) of the interposer substrate 101. The communication LSI is an example of an IC element for communication.

<Light-Receiving Element>

In the light-receiving-side optical module of the first embodiment, the case is exemplified where the light-receiving element 118 is used as a photodiode that performs photoelectric conversion of an optical signal that has passed through the optical fiber 126 and the optical waveguide 116. For example, in case that the optical module structure is a light-emitting-side optical module, the light-receiving element 118 is replaced by a light-emitting element. The light-emitting element may be a VCSEL element or an LED element. The VCSEL element is an abbreviation for Vertical Cavity Surface Emitting Laser and is one type of a semiconductor laser that resonates light in a direction orthogonal to the substrate surface to emit light in the orthogonal direction to the surface. The light-receiving element 118 and the light-emitting element are an example of an optical element and the optical module structure has only to comprise the optical element.

<IC Element>

In the light-receiving-side optical module of the first embodiment, the case is exemplified where the IC element 122 is used as a transimpedance amplifier that subjects an electrical signal photoelectrically converted by the light-receiving element 118 to impedance conversion and amplification for output. In case that the optical module structure is the light-emitting-side optical module, the IC element may be a driver element for driving the light-emitting element.

<Si Bench Substrate>

Use of the Si bench substrate 112 enables the surface to undergo high-precision etched grooving by utilizing the Si crystal orientation, ensuring an excellent flatness.

<Optical Waveguide and Optical Fiber>

Although there are arranged the optical waveguide 116 optically connecting to the IC element 122 as well as the optical fiber 126 optically connecting to the optical waveguide 116, the optical waveguide 116 need not necessarily be disposed.

<Manufacturing Method>

Figure 3:
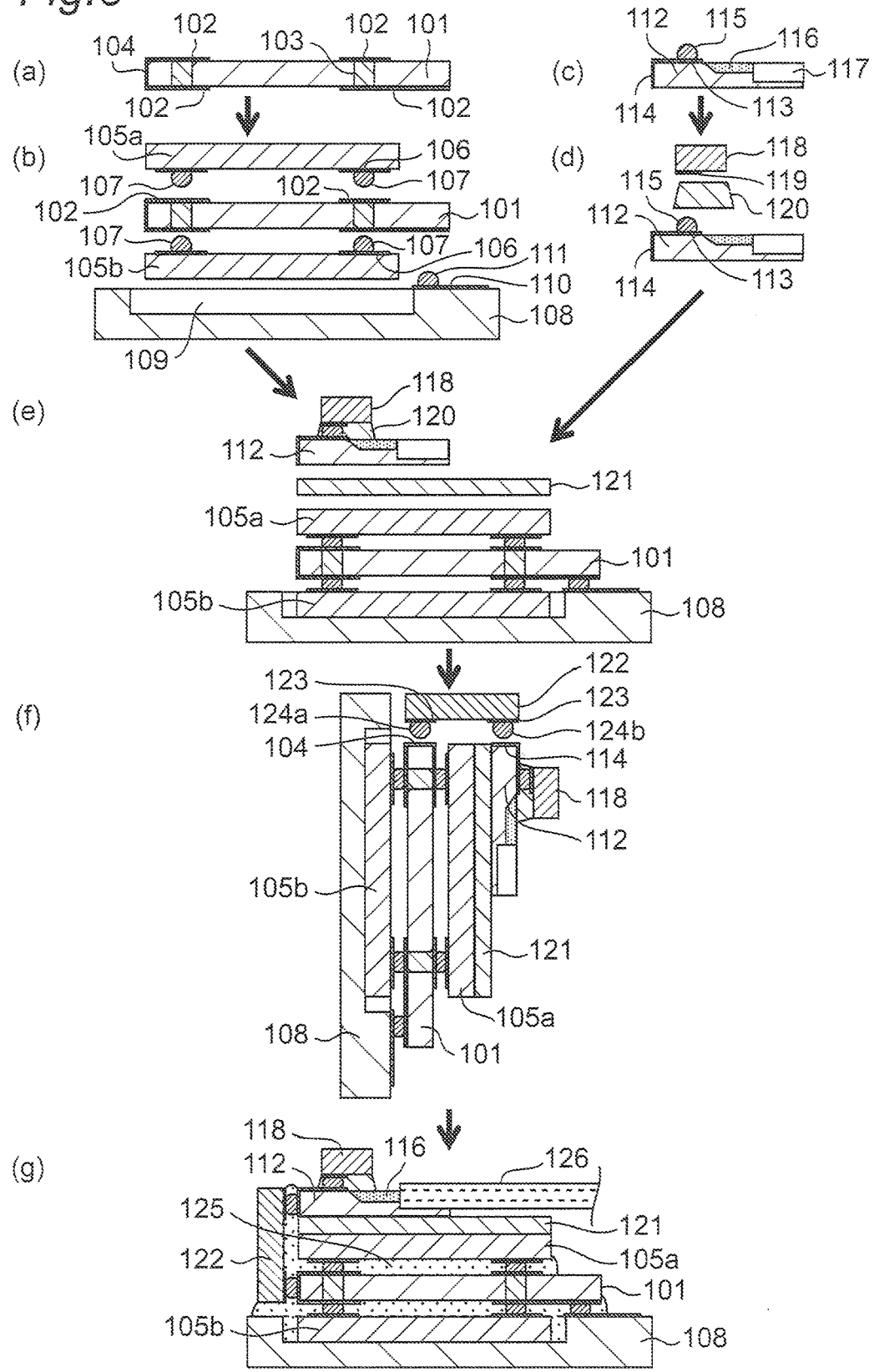
FIG. 3 is a sectional view showing forming steps (a) to (g) of the light-receiving-side optical module structure in the first embodiment of the present invention.

FIG. 3 shows an example of a manufacturing process creating such a light-receiving-side optical module.

First, as shown in FIG. 3(*a*), the connection terminals 102 are formed on the respective main surfaces of the interposer substrate 101, while a through-hole 103 is formed that passes through between and connects both the main surfaces, and furthermore the lateral-surface connection terminal 104 is formed on the lateral surface.

Next, as shown in FIG. 3(*b*), the two communication LSIs 105*a* and 105*b* are superimposed on both the main surfaces of the interposer substrate 101 such that the connection terminals 102 of the interposer substrate 101 and the connection terminals 106 of the communication LSI 105*a* and 105*b* are electrically connected via the second protruding electrodes 107. Subsequently, the communication LSI 105*b* is disposed in the cavity 109 formed on the main substrate 108 such that the connection terminal 102 of the interposer substrate 101 and the connection terminal 110 of the main terminal 108 are electrically connected via the first protruding electrode.

By adjusting the depth of the cavity 109, a gap between the connection terminal 102 of the interposer substrate 101 and the connection terminal 110 of the main substrate 108 can be adjusted, enabling a connection through a shortest path via the first protruding electrode 111.

On the other hand, as shown in FIG. 3(c), the connection terminal 113 is formed on the main surface of the Si bench substrate 112, the lateral-surface connection terminal 114 is formed on the lateral surface, and the fifth protruding electrode 115 is formed on the connection terminal 113. Furthermore, the optical waveguide 116 and a V-groove 117 are formed on the Si bench substrate 112.

Next, as shown in FIG. 3(d), the light-receiving element 118 is disposed on top of the Si bench substrate 112, the connection terminal 113 of the Si bench substrate 112 and the connection terminal 119 of the light-receiving element 118 are electrically connected via the fifth protruding electrode 115, and the connection portion is sealed and fixed by the sealant 120.

Next, as shown in FIG. 3(e), the Si bench substrate 112 is disposed on and joined to the communication LSI 105a via the heat-radiating sheet 121 for thickness adjustment.

At this time, by adjusting the thickness of the heat-radiating sheet 121 for thickness adjustment, the distance between the lateral-surface connection terminal 104 of the interposer substrate 101 and the lateral-surface connection terminal 114 of the Si bench substrate 112 can be adjusted to a predetermined distance.

Next, as shown in FIG. 3(f), the IC element 122 is disposed on the lateral-surface side of the interposer substrate 101 and the Si bench substrate 112. The lateral-surface connection terminal 104 of the interposer substrate 101 and the connection terminal 123 of the IC element 122 are electrically connected via the third protruding electrode 124a, while the lateral-surface connection terminal 114 of the Si bench substrate 112 and the connection terminal 123 of the IC element 122 are electrically connected via the fourth protruding electrode 124b.

Finally, as shown in FIG. 3(g), the connection portions are sealed and fixed by the sealant 125. The optical fiber 126 is disposed in the V-groove 117 of the Si bench substrate 112, to complete the light-receiving-side optical module.

<Effect>

According to the optical module of the first embodiment, the paths can be shortened that provide connections between the light-receiving element 118, the Si bench substrate 112, the IC element 122, the interposer substrate 101, the communication LSIs 105a and 105b, and the main substrate 108 that make up the optical module. This can suppress the degradation of the high-frequency signals to increase the transmission speed. By adjusting the thickness of the heat-radiating sheet 121 for thickness adjustment, the stresses at the join portions can be relieved, thus enabling a small-sized optical module structure having a high reliability to be provided.

Second Embodiment

Figure 4:
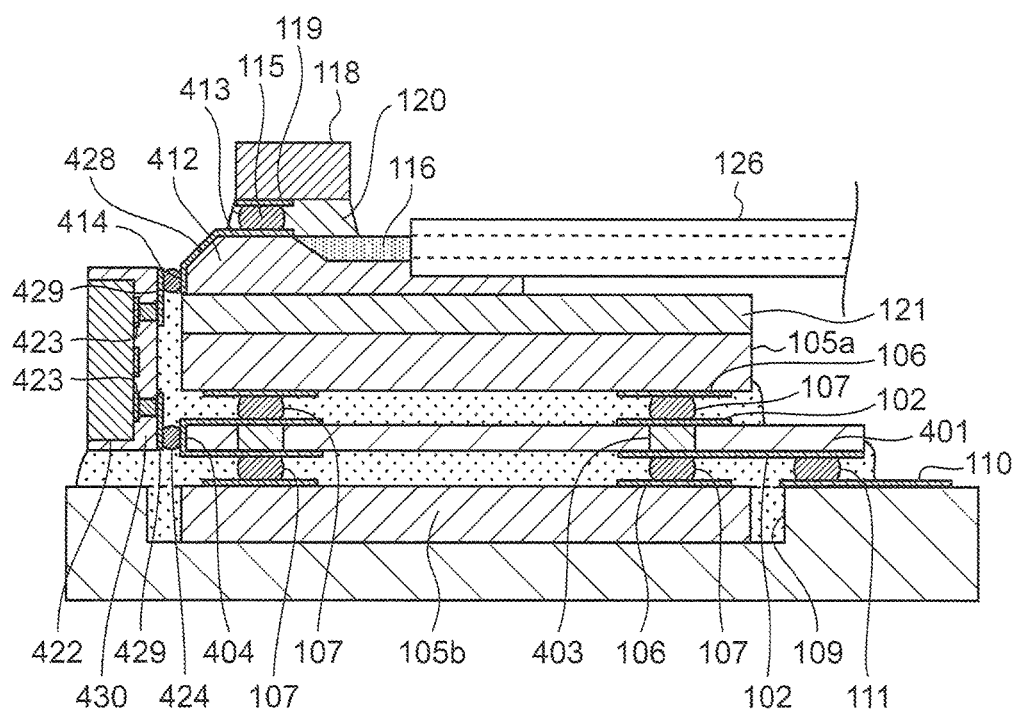
FIG. 4 is a sectional view showing a configuration of a light-receiving-side optical module structure in a second embodiment of the present invention.

FIG. 4 shows a sectional view of a light-receiving-side optical module as an optical module structure according to a second embodiment of the present invention. In the optical module of the second embodiment of the present invention, description will mainly be given of differences from the optical module of the first embodiment and substantially similar portions will not again be described.

A lateral-surface connection terminal 404 formed on an interposer substrate 401 is electrically connected via a third protruding electrode 424 to a connection terminal 429 formed on an IC element 422.

The interposer substrate 401 is formed thin so that the thickness of the interposer substrate 401 becomes equal to or less than the outer diameter (e.g. length dimension in top-to-bottom direction in FIG. 4) of the third protruding electrode 424.

This allows a through-hole 403 passing through between the main surfaces of the interposer substrate 401 to have a larger aspect ratio (ratio of width/height in FIG. 4) so that the resistance value of the through-hole 403 can be lowered. It thus becomes possible to suppress the degradation of high-frequency signals in the optical module.

Furthermore, at least part of wiring joining a connection terminal 413 formed on a main surface (top surface in FIG. 4) of an Si bench substrate 412 and a lateral-surface connection terminal 414 formed on a lateral surface (left lateral surface in FIG. 4) forms a slant portion 428 that is slanted with respect to the main surface and the lateral surface. The disposition of such a slant portion 428 allows the wiring on the Si bench substrate 412 to have a shorter length, as compared with the case where the slant portion 428 is not disposed, making it possible to suppress the transmission loss.

As used herein, the slant means that a slant portion 428 is inclined with respect to the surface (main surface) having the connection terminal 413 formed thereon and the surface (lateral surface) having the lateral-surface connection terminal 414 formed thereon.

In the optical module of the second embodiment, the connection terminals (rewired connection terminals) 429 of the IC element 422 are formed by rewiring the respective terminals disposed on the IC element 422 itself so that the interval therebetween becomes equal to the interval between the lateral-surface connection terminal 404 of the interposer substrate 401 and the lateral-surface connection terminal 414 of the Si bench substrate 412.

<Rewiring>

Formation steps for rewiring of the IC element 422 are shown in FIGS. 5(a) to 5(f).

Figure 5:
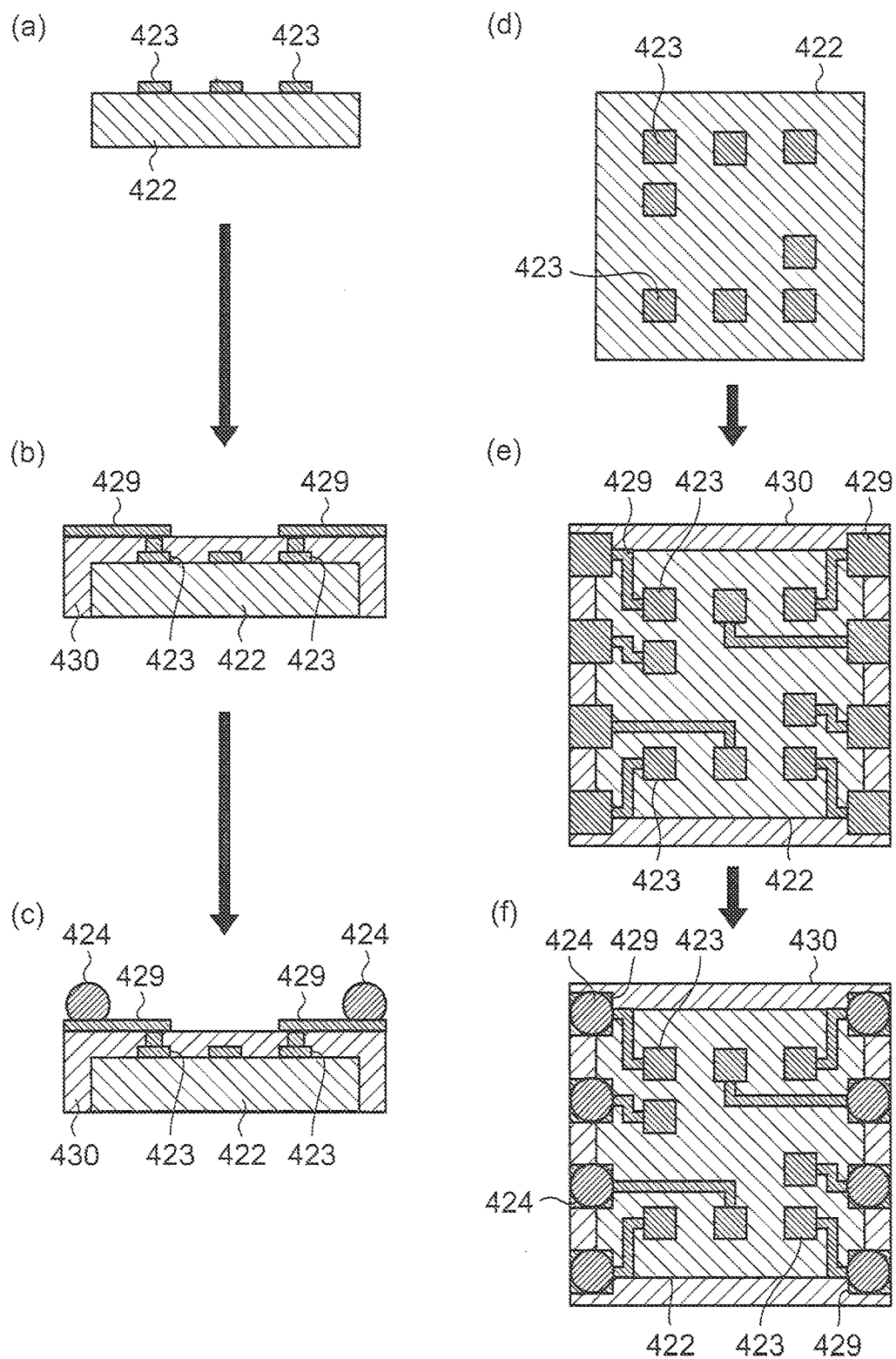
FIG. 5 is a sectional view showing forming steps (a) to (f) of rewiring in the light-receiving-side optical module structure in the first embodiment of the present invention.
Figure 6:
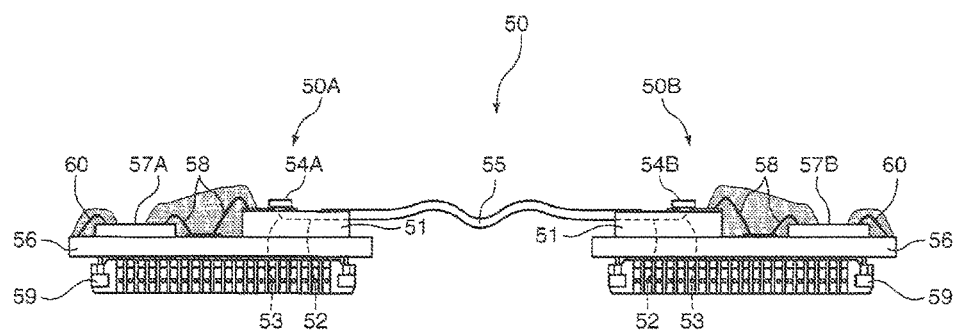
FIG. 6 is a sectional view showing a configuration of a conventional optical module structure.
Figure 7:
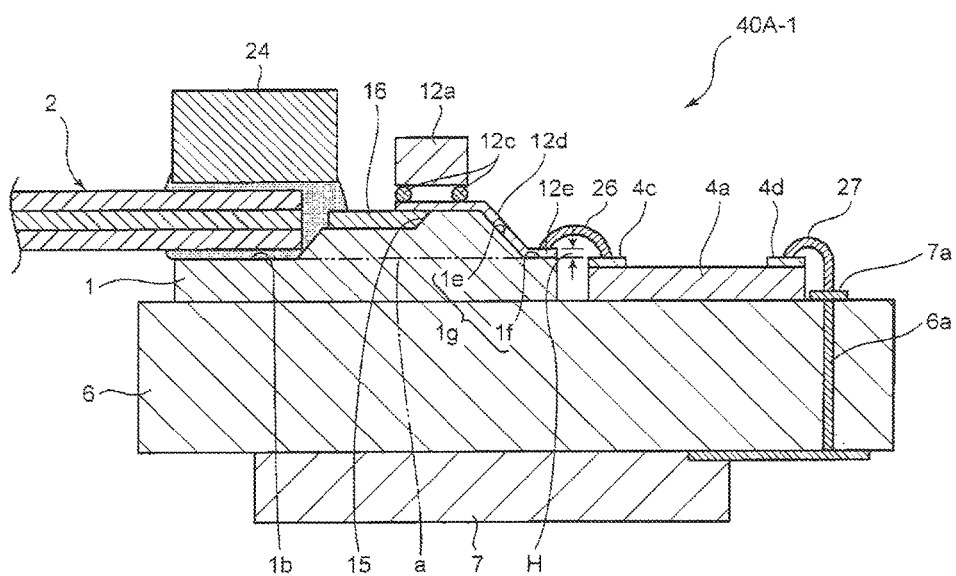
FIG. 7 is a sectional view showing a configuration of a conventional bonding-wire-connected light-emitting-side optical module structure.
Figure 8:
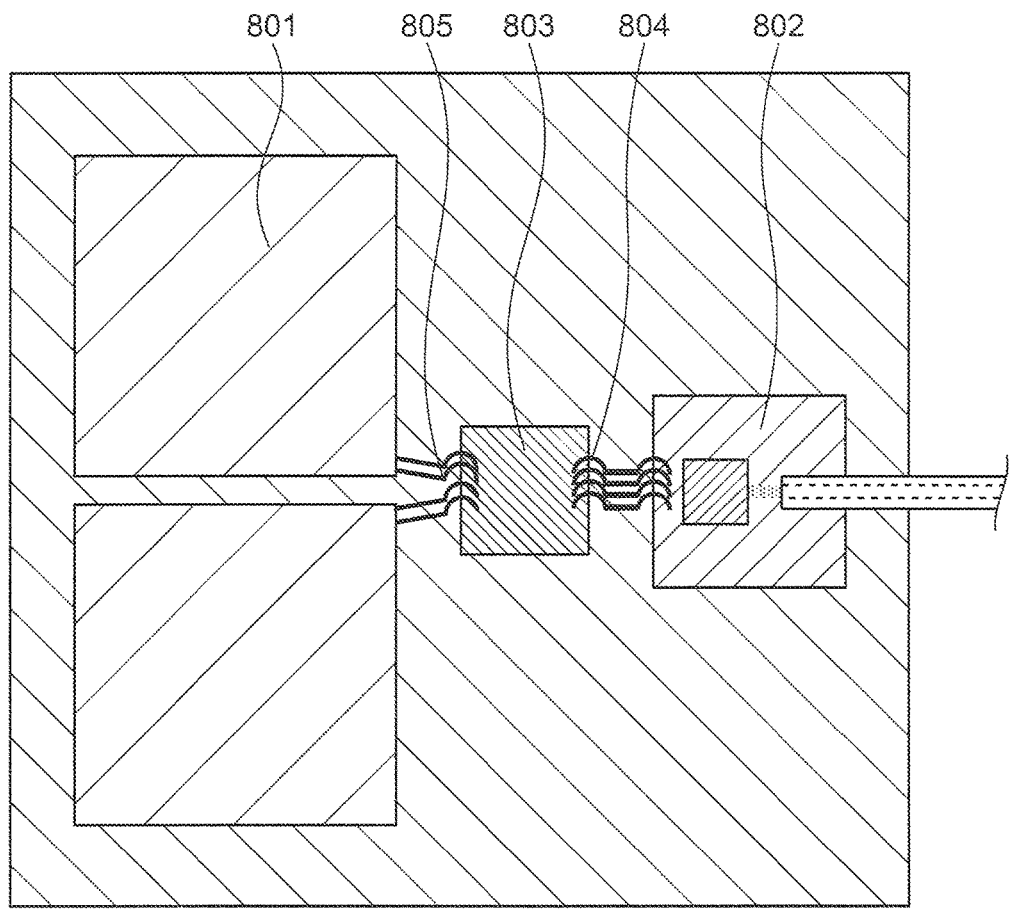
FIG. 8 is a plan view showing a configuration of a conventional light-emitting-side optical module structure based on a 4-level pulse amplitude modulation scheme.

FIGS. 5(a) to 5(c) are sectional views of the IC element 422 and FIGS. 5(d) to 5(f) are plan views of the IC element 422.

First, as shown in FIGS. 5(a) and 5(d), a plurality of terminals 423 are arranged on the IC element 422.

Next, as shown in FIGS. 5(b) and 5(e), a rewiring layer 430 is formed, the interval between the connection terminals of the IC element 422 is adjusted to become a predetermined interval, and the plurality of connection terminals (rewired connection terminals) 429 are arranged on the outside of the IC element 422.

Finally, as shown in FIGS. 5(c) and 5(f), the third protruding electrodes 424 are formed on the connection terminals 429, to complete the rewiring.

The rewiring means that on the outside of the IC element 422 there lie the connection terminals 424 arranged parallel to the external surface.

<Effect>

According to the optical module of the second embodiment, the paths can be shortened that provide connections between the elements making up the optical module, thereby suppressing the degradation of high-frequency signals to achieve an increase in the transmission speed. Even though the IC element is a general-purpose part, the connection with the lateral-surface connection terminals becomes possible by adjusting the interval dimension between the connection terminals through the rewiring, consequently enabling a small-sized optical module structure to be provided.

By properly combining any embodiments among the various embodiments described above, their respective effects can be presented.

Although the present invention has fully been described in relation to the preferred embodiments with reference to the accompanying drawings, various modifications and alterations are apparent to those skilled in the art. It is to be understood that such modifications and alterations are encompassed within the scope of the present invention without departing from the scope defined by the appended claims.

The optical module structure of the present invention is applicable to a lot of equipment using optical communications. It is available for equipment communicating a large volume of data such as digital video equipment and broadcast equipment.

EXPLANATIONS OF REFERENCE NUMERALS 1 substrate
1e slant surface
1f horizontal surface
4a signal processing unit
4c land
4d land
6 substrate
6a through-hole wiring
7 connector
7a land
12a light-emitting element
12c bump
12e land
26 bonding wire
27 bonding wire
50 optical module
50A light-emitting-side optical module
50B light-emitting-side optical module
51 substrate
52 internal waveguide
53 mirror portion
54A light-emitting element
54B light-receiving element
56 substrate
57A signal processing unit
58 bonding wire
59 connector
60 bonding wire
101 interposer substrate
102 connection terminal
103 through-hole
104 lateral-surface connection terminal
105 communication LSI
105a communication LSI
105b communication LSI
106 connection terminal
107 second protruding electrode
108 main substrate
109 cavity
110 connection terminal
111 first protruding electrode
112 Si bench substrate
113 connection terminal
114 lateral-surface connection terminal
115 fifth protruding electrode
116 optical waveguide
117 V-groove
118 light-receiving element
119 connection terminal
120 sealant
121 heat-radiating sheet for thickness adjustment
122 IC element
123 connection terminal
124a third protruding electrode
124b fourth protruding electrode
125 sealant
126 optical fiber
127 connection terminal pitch
401 interposer substrate
403 through-hole
404 lateral-surface connection terminal
412 Si bench substrate
413 connection terminal
414 lateral-surface connection terminal
422 IC element
423 terminal
424 third protruding electrode
428 slant portion
429 connection terminal
430 rewiring layer
801 communication LSI
802 Si bench substrate
803 substrate
804 bonding wire
805 bonding wire

The invention claimed is:

1. An optical module structure comprising:
a main substrate,
an interposer substrate electrically connected to the main substrate via a first protruding electrode;
a first communication LSI electrically connected to the interposer substrate via a second protruding electrode;
an IC element electrically connected to the interposer substrate via a lateral-surface connection terminal of the interposer substrate and via a third protruding electrode;
an Si bench substrate electrically connected to the IC element via a fourth protruding electrode and via a lateral-surface connection terminal of the Si bench substrate;
an optical element electrically connected to the Si bench substrate via a fifth protruding electrode; and
an optical fiber optically connected via an optical waveguide formed on the Si bench substrate.

2. The optical module structure according to claim 1, comprising a second communication LSI electrically connected to the interposer substrate.

3. The optical module structure of claim 2, wherein the main substrate comprises a cavity in which the second communication LSI lies.

4. The optical module structure according to claim 1, comprising a heat-radiating sheet disposed between the first communication LSI and the Si bench substrate, for joining the both together.

5. The optical module structure according to claim 4, wherein the heat-radiating sheet is softer than the communication LSI, the interposer substrate, the main substrate, and the Si bench substrate.

6. The optical module structure according to claim 4, wherein
the IC element comprises a connection terminal connected to the third protruding electrode and a connection terminal connected to the fourth protruding electrode, and
the heat-radiating sheet is disposed as a thickness adjusting sheet between the interposer substrate and the Si bench substrate so that a distance between the connection terminals of the IC element becomes equal to a distance between the lateral-surface connection terminal of the interposer substrate and the lateral-surface connection terminal of the Si bench substrate.

7. The optical module structure according to claim 1, wherein a thickness of the interposer substrate is equal to or less than an outer diameter of the third protruding electrode electrically connecting the lateral-surface connection terminal of the interposer substrate and the connection terminal of the IC element.

8. The optical module structure according to claim 1, wherein
   the Si bench substrate comprises on its main surface a connection terminal connected to the fifth protruding electrode and comprises on its lateral surface the lateral-surface connection terminal, and
   at least part of wiring joining the connection terminal and the lateral-surface connection terminal of the Si bench substrate is inclined with respect to both the main surface and the lateral surface.

9. The optical module structure according to claim 1, wherein the IC element has on its external surface the connection terminals rewired such that an interval between the connection terminals becomes equal to an interval between the lateral-surface connection terminal of the interposer substrate and the lateral-surface connection terminal of the Si bench substrate.

* * * * *